United States Patent
Timieski

[11] Patent Number: 6,133,652
[45] Date of Patent: Oct. 17, 2000

[54] GROUNDING AND RFI ISOLATION FOR CONTROL STATIONS

[75] Inventor: Mark E. Timieski, Lakewood, Ohio

[73] Assignee: ELSAG International N.V., Netherlands

[21] Appl. No.: 09/378,424

[22] Filed: Aug. 20, 1999

Related U.S. Application Data

[62] Division of application No. 08/900,493, Jul. 25, 1997, Pat. No. 5,977,480.
[60] Provisional application No. 60/027,116, Sep. 30, 1996.

[51] Int. Cl.[7] .................................................. H04B 3/28
[52] U.S. Cl. .............................................. 307/91; 174/35
[58] Field of Search ................................ 307/91; 174/51, 174/35, 115; 343/825, 846; 439/92, 607

[56] References Cited

U.S. PATENT DOCUMENTS

| | | |
|---|---|---|
| 4,187,481 | 2/1980 | Boutros .................................... 333/182 |
| 4,386,819 | 6/1983 | Asick et al. ........................... 339/147 R |
| 4,551,633 | 11/1985 | Winter et al. ............................ 307/147 |
| 5,170,008 | 12/1992 | Evans et al. ............................... 174/35 |
| 5,627,898 | 5/1997 | Washino ................................... 381/177 |
| 5,726,603 | 3/1998 | Chawla et al. ........................... 330/269 |
| 5,977,480 | 11/1999 | Timieski ............................... 174/35 R |

*Primary Examiner*—Josie Ballato
*Assistant Examiner*—Robert L. DeBeradinis
*Attorney, Agent, or Firm*—Vytas R. Matas

[57] ABSTRACT

A radio frequency isolation system for geographically distance signal sources comprising AC and DC signals which develop differences in ground potential includes a control cabinetry chassis with the DC input signal source being electrically grounded to the chassis at the input side of the cabinetry and a hybrid circuit connected to the chassis through capacitors with the AC input signal being connected to the hybrid circuit for grounding the signal at both the input and output ends of the hybrid circuit to the chassis.

10 Claims, 4 Drawing Sheets

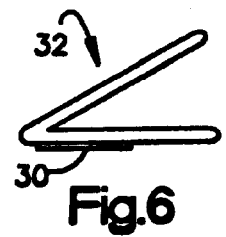
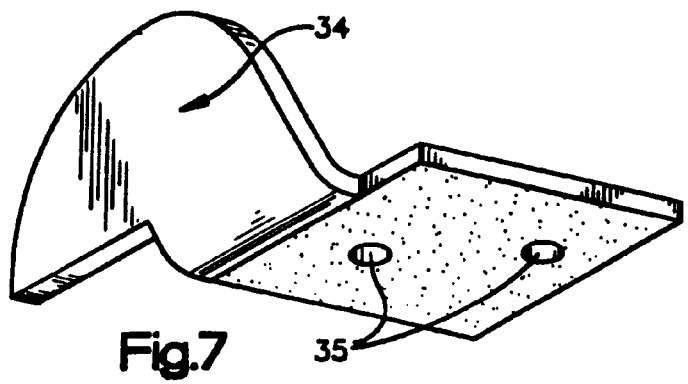
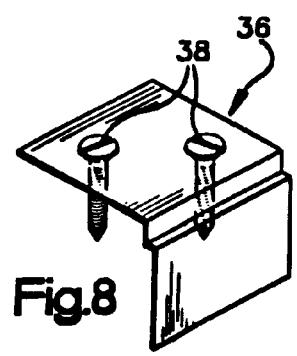
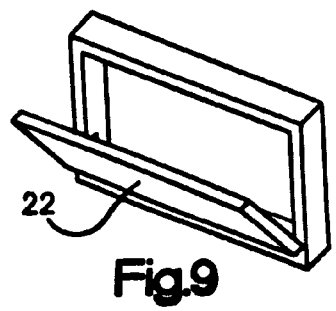
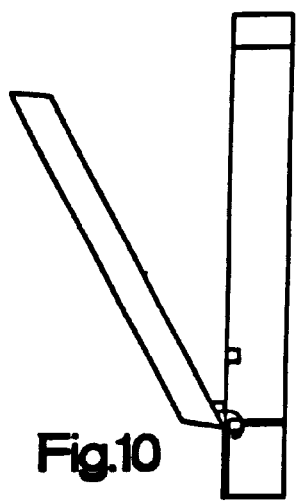
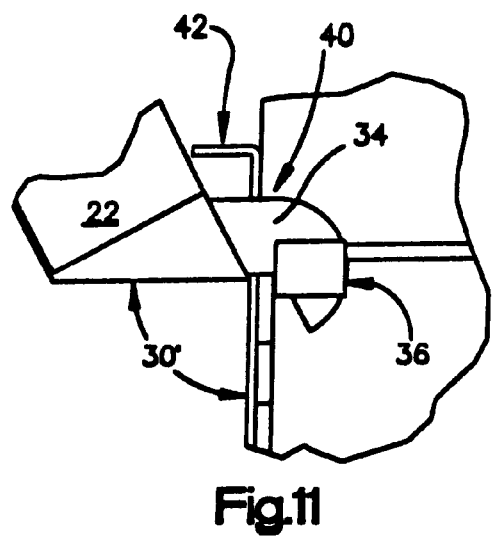

GROUNDING AND RFI ISOLATION FOR CONTROL STATIONS

This application is a divisional of application Ser. No. 08/900,493 filed Jul. 25, 1997 now U.S. Pat. No. 5,977,480, issued on Nov. 2, 1999, which is based on provisional application Ser. No. 60/027,116 filed Sep. 30, 1996.

BACKGROUND OF THE INVENTION

1. Field of the Invention

The present invention relates to the grounding and RFI isolation of control stations in general and more particularly to such control stations which have the need for remote location ground variation compensation and improved RFI isolation.

2. Description of the Prior Art

Control stations are known to have remote signal inputs thereto which may originate up to a mile from the station. This geographical difference causes ground potential differences which need to be considered. Also, in certain worldwide markets RFI isolation (containment of the RFI field within the cabinet) requirements are being made more stringent. This is especially true in the European market.

To date, prior art techniques for ground isolation did not consider such geographical ground potential differences due to remote signal origins and depended on mere metal shielding for RFI isolation.

Distributed process control systems such as the ELSAG BAILEY SYMPHONY™ system which utilizes control stations referred to as Operator Interface Stations or consoles have a major problem in complying with the requirements for obtaining a CE Mark for compliance with European RFI emission. This is due to the lack of sufficient high frequency grounding for the consoles front and rear door. The consoles are designed to have a 12 gauge green/yellow wire that is several inches long, connecting the door to the chassis of the console. The wire was added as a safety connection to meet UL(Underwriter Laboratories) and CSA (Canadian Standards Association) requirements. These requirements were for metal access doors to be grounded to the chassis so that only "hot" wires touching the door will blow a breaker/fuse and not produce a harmful voltage on the chassis which could cause the operator or service person to come into contact with this voltage. While the wire works for a safety ground it is insufficient for higher frequencies isolation.

The following rules apply to conductors carrying high frequencies:

a. Increasing rectangular conductor thickness by lox decreases induction by 10%.

b. Increasing the width of the induction by lox decreases induction by 30%.

c. decreasing the length of a rectangular conductor by lox decreases induction by 93%.

Thus, a long wire makes an extremely poor ground as the inductance becomes extreme even at only a few inches. The best conductor for RF frequencies is an extremely short 'wire'.

Another problem with ground wiring is that the system is easily bypassed by some customers. Once the door is opened, the screw which holds the wire connected to the chassis must by removed to gain access to the console electronics therein. Often the wire is left unconnected when the door is replaced.

Thus the door grounding was needed which would have the following requirements:

a. The ground connections must consist of a wide and short electrical connection to the chassis. This is to provide proper RF grounding of the door.

b. In addition, a more positive connection of door to chassis was needed to replace the green/yellow wire to account for a safety ground not easily disconnected by customers.

c. The grounding scheme should be an integral part of the door and chassis and should be simple to use requiring no disconnection to access the internal electronics.

Thus with the advent of new process control equipment which receives remote signal inputs from up to a mile away and which control equipment may be located in environments of high RFI sourcing, an improved control station which compensates for such geographical ground potentials and also has a very effective RFI isolation cabinetry was required.

BRIEF SUMMARY OF THE INVENTION

The present invention solves the problems associated with prior art systems as well as others by providing an improved control station which compensates for geographical ground potentials and also has a very effective RFI isolation cabinetry.

To accomplish this end the cabinet door openings have a conductive foil strip glued to the unpainted wall section of the metal cabinet opening of the control station. The door covering this opening also has the same conductive foil strip glued to the unpainted mating wall section of the door abutting the cabinet wall. A V-shaped conductive shielding gasket is located between the door and the cabinet wall sections to be compressed therebetween and to thus fill any gaps due to misalignment or warping of the door or cabinet wall sections.

The grounding is effected by having a large area stainless steel hinge mounted to the door to fit into the cabinet wall and be spring loaded thereto to allow the swinging down of the door. Also, a hybrid ground circuit is provided which grounds the DC at only one end of the circuit while grounding the AC signals at both ends of the circuit. The single end grounding eliminates geographical ground potential differences due to input signal locations to the cabinet which may be up to a mile distant from the cabinet.

In view of the foregoing it will be seen that one aspect of the present invention is to provide an improved RFI isolation system for control stations in high RFI environments.

Another aspect of the present invention is to provide a positive grounding of the control station compensating for the geographical ground potential differences resulting from remote signal inputs originally at long distances from the control station.

These and other aspects of the present invention will be more fully understood upon a perusal of the following description of the preferred embodiment when considered in conjunction with the drawings.

BRIEF DESCRIPTION OF THE DRAWINGS

FIG. 6. is an end view of the V-shaped conductive gasket fitting between the conductive strips of the cabinet and door.

FIG. 7. is a perspective view of a spring latch used to pen the cabinet doors of FIGS. 4–5.

FIG. 8. is a perspective view of a spring clip used to ground the door to the chassis.

FIG. 9. is a perspective view of spring latch of FIG. 7 mounted to swing open the doors of FIGS. 4–5.

FIG. 10. is a side view of the FIG. 9 assembly.

FIG. 11. is an exploded view of the latch section A—A of FIG. 10.

DETAILED DESCRIPTION OF THE PREFERRED EMBODIMENT

Figure 1:
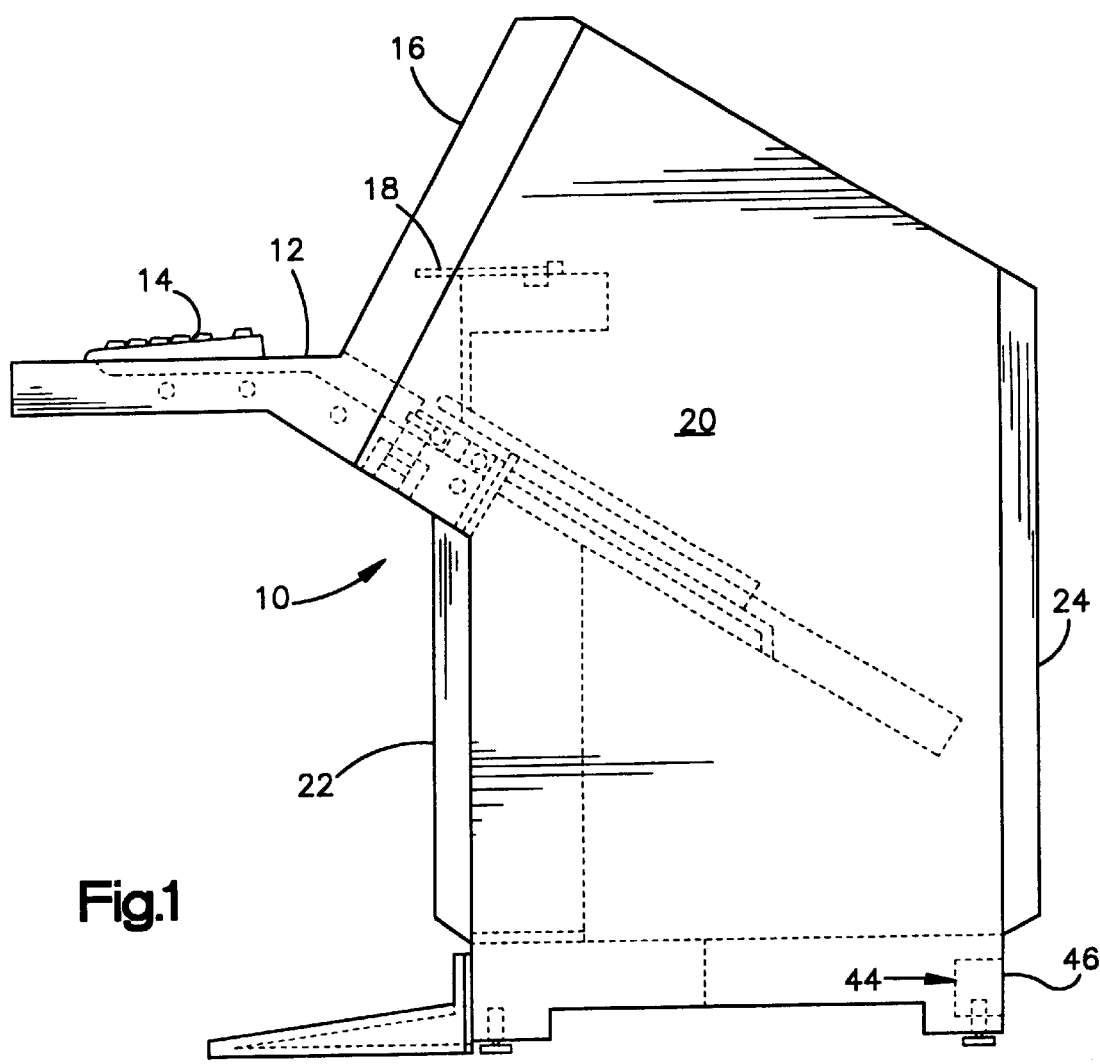
FIG. 1. is a side view of the distributed process control system control cabinet of the present invention.
Figure 2:
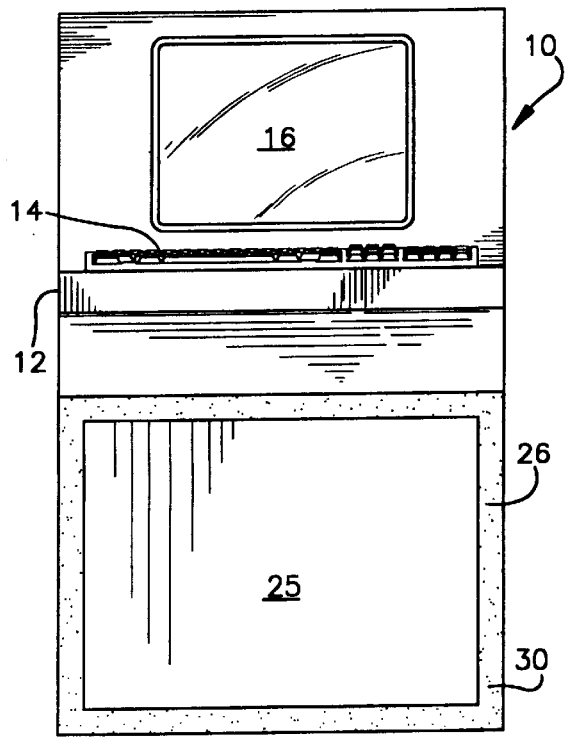
FIG. 2. is a front view of the FIG. 1 cabinet showing the location of the conductive strip along the wall section of the front opening with the door removed.
Figure 3:
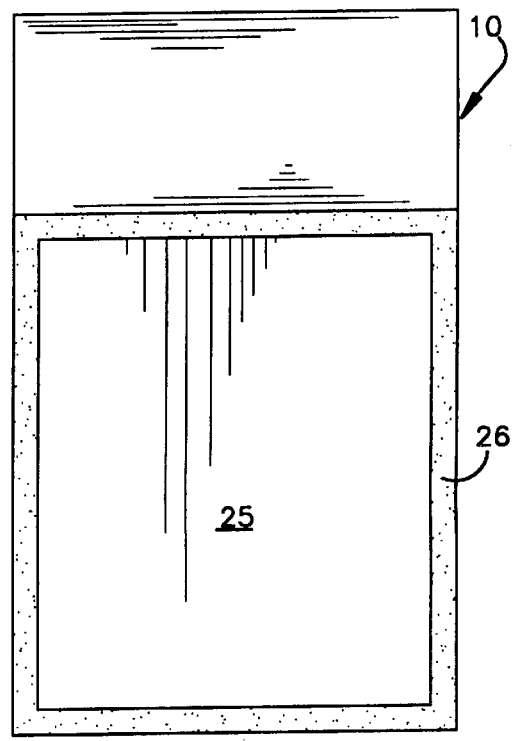
FIG. 3. is a back view of the FIG. 1 cabinet showing the location of the conductive strip along the wall section of the back opening with the door removed.
Figure 4:
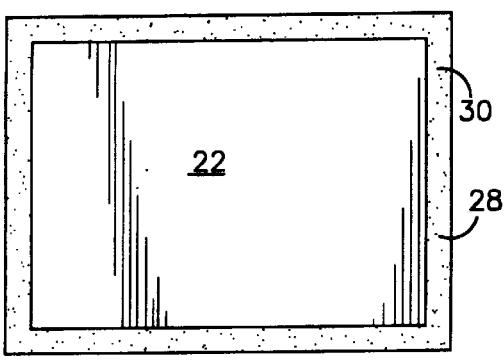
FIG. 4. is a back view of the front door of the FIG. 1 cabinet.
Figure 5:
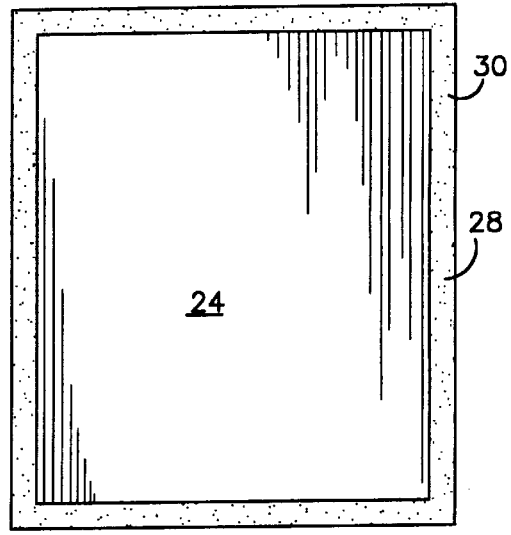
FIG. 5. is a back view of the back door of the FIG. 1. cabinet.

Referring now to the drawings with particular reference to FIGS. 1 through 6, a distributed process control systems is shown such as the ELSAG BAILEY SYMPHONY™ system which utilizes control stations 10. These stations 10 comprise a work station 12 with a keyboard 14 thereon, a screen monitor 16 and a drive for floppy disks 18. The station 10 has a cabinet 20 which is accessible by a front door 22 and a back door 24 both of which are hinged through a hinge assembly (not shown) of large area to help ground the cabinet. The doors 22, 24 cover openings 25 leading to the inside of the cabinet 20. The openings 25 have a formed metal lip or wall 26. The doors 22, 24 also have a formed complimentary lip or wall 28. The walls 26, 28 of both the doors and the cabinet are covered with an adhesive backed conductive film or strip 30 as described in CHOMERIC bulletin 210 entitled "CHO-MASK" Conductive Foil Tape with Pull-Off Mark" the content of which is incorporated herein by reference. This tape is applied to the walls 26, 28 before they are painted by removing one side of the adhesive back therefrom and pressing the film 30 to the walls 26, 28. The cabinet and walls 26, 28 are then painted. A v-shaped conductive gasket 32 available from Grace company and identified as their "EMI Shielding Gasket for Commercial Electric Enclosures" described in their CHOMERIC Product Data Sheet for same is then glued to the doors 22, 24. This is done by removing the adhesive sheet from the other side of the film 30 to expose the adhesive and allow the gasket 32 to adhere thereto. Thus when the doors are placed back over the openings 22, 24 any gaps are taken up by the compressed V-shaped gasket 32. The doors 22, 24 are pivoted into the cabinet using the large area swing latches shown in FIGS. 7–10 to provide a high frequency ground for CE Mark compliance, as well as a safety ground for UL/CSA compliance.

The door hinge 34 is manufactured from Stainless steel and then welded to the door 22 as best seen in FIG. 11. The hinge 32 must be masked prior to painting the door 22 so that the hinge remains conductive. As an alternative, the hinge could be bolted to the door 22 by bolts extending through openings 35 if welding stainless steel to the door is difficult.

The door hinge, conductive foil tape, and v-shaped conductive gasket are electrically connected through the unpainted sections of the door and cabinetry.

The hinge 34 makes electrical contact to the chassis 20 through the use of four spring clips 36 (2 for each hinge). Each spring clip 36 is held to the chassis 20 by two screws 38 which mount the clips 36 along an opening therein to have the spring clips 36 rub along the door hinge 34 as the door is inserted into channels 40 found in the chassis 20. A stop bracket 42 is also used so that the door must be open to at least 30 degrees before it is removed. This prevents the off chance that a high potential wire is near the door perimeter and it comes into contact with the door as it is opened. The person removing the door has a clear view into the console before removing the door.

Figure 12:
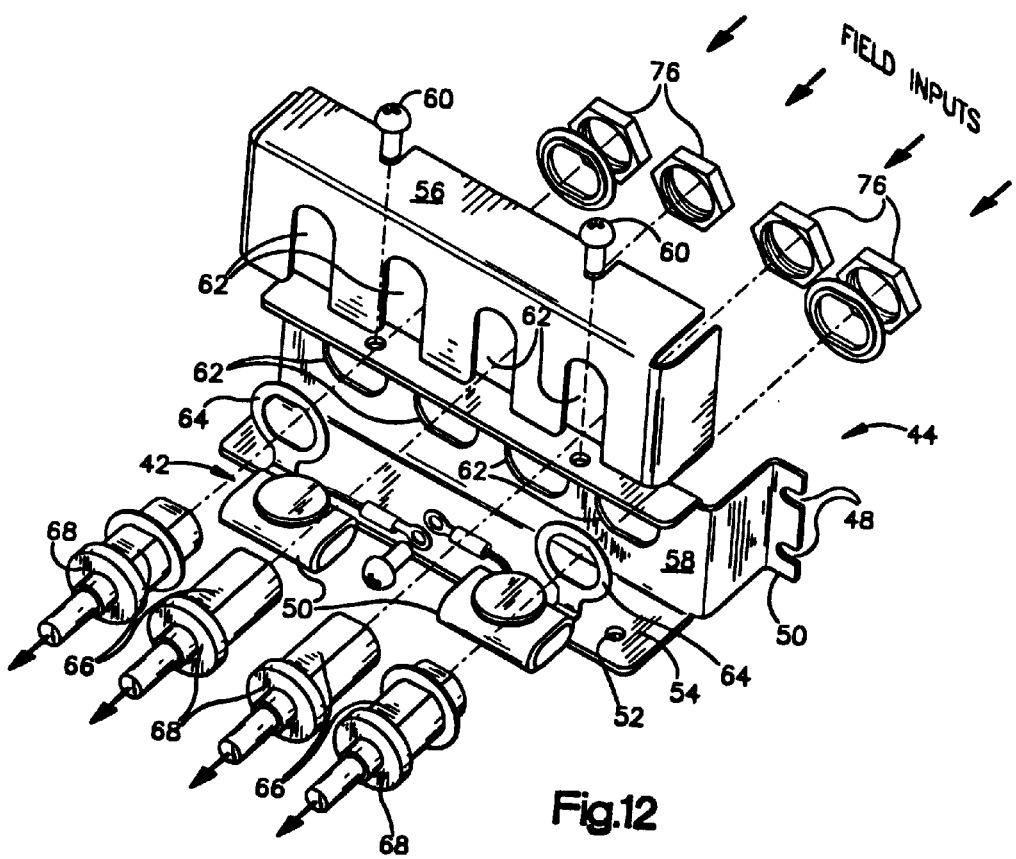
FIG. 12. is a perspective view of the ground circuit system located on the bottom of the FIG. 1. cabinet having two input and two output lines on opposite sides thereof electrically connected to a hybrid electrical circuit sealed in an elongated oval container.

RFI isolation is provided by the isolation assembly 44 shown in FIG. 12. This assembly 44 has a pair of inputs from signal sources that may be up to a couple of kilometers from the cabinet 20. This geographical distance may result in the occurrence of a potential being developed due to differences in ground potential between these geographically distant locations. This voltage potential may cause heating of the input wires which may burn up the signal lines. Thus the inputs are filtered through a electrical hybrid ground circuit 42 as shown schematically in FIG. 13. This circuit eliminate these ground potential differences and prevents the danger of signal wire deterioration due to the wire heating generated by these potential differences.

Figure 13:
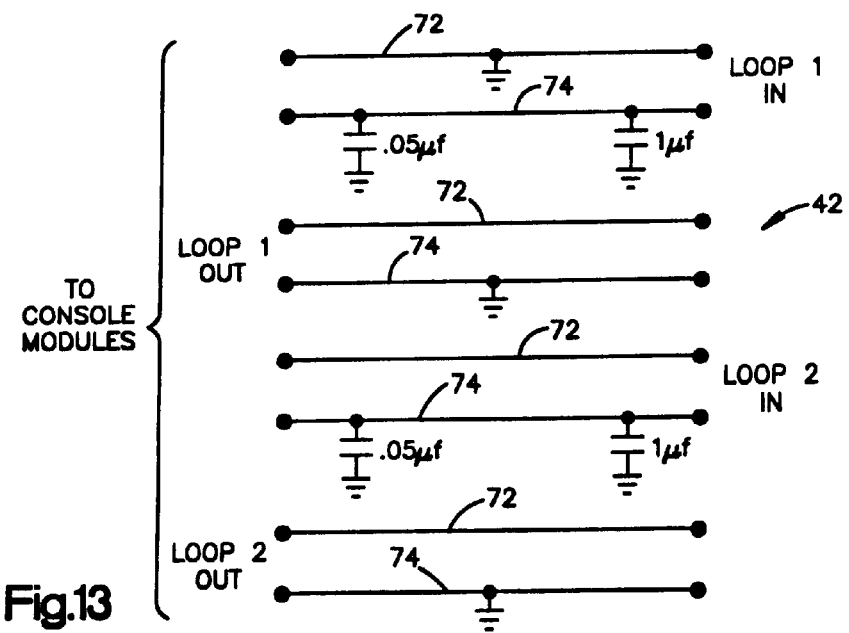
FIG. 13. is a schematic of the hybrid electrical circuit of FIG. 11.

The circuit assembly 44 is best seen in FIGS. 12 and 1. The assembly 44 is mounted inside the cabinet 20 through a bottom aperture 46 found at the back of the cabinet 20.The mounting is done through screw slots 48 found on the flanges 50 of the assembly 44 in a known manner. The hybrid electrical assembly 42 is encased in cases 50 with the cases 50 screwed into holes 52 located on a bottom flange 54 of the assembly 44. A case 50 cover 56 is screwed into the main body 58 of the assembly 44 by screws 60 in a known manner. The main body 58 as well as the cover 56 has apertures 62 and slip rings 64 through which input and output loop connectors 66 are extended and connected to the body by flanges 68 and nuts 76 on opposite sides of the body 58 in a known manner. The assembly 44 provides for two field inputs and two outputs comprising a pair of loop inputs and outputs as best seen in FIG. 13. The loop inputs and output are connected to the circuit through shielded connectors as is known in the art to thus have the ground for DC signals going through one end while the AC is grounded at both ends.

The largest source of noise appears to be generated by the loop cables. At the current time there is no "solid" ground provided for the shield of these coaxial cables. Cable shields are currently grounded at the receive end through a 1 M ohm resistor and are capacitively coupled to the transmitter end by one "chicklet" capacitor. These capacitors have shown to work very poorly at higher frequencies and any resistance in series with the ground connection seems to severely hamper any ability to drain off RFI energy.

The present design uses "N" style pass through bulkhead connectors. The transmit side 72 or input of each loop is hard grounded through the keyholes 64 which are connected to the chassis 22 through the metal body 58 connection. The receive side 74 is capacitively coupled with a 1 microfarad and 0.05 microfarad capacitor to chassis 22. The 1 microfarad capacitor is designed for use in application such as this where very large transient voltages may occur. While the capacitor is rated for 250 vac. it can handle voltage transients in access of 1 KV. While this capacitor can handle large voltages, it provides poor capacitance at the frequencies of interest (30 to 250 MHZ) as this capacitor is mostly inductive. This capacitor must survive due to low frequency transients. Thus the smaller capacitor is provided which will do the bulk of the work at the higher frequencies.

The small bracket assembly 44 is designed so that the cables can be connected horizontally or the cables can come through the floor of the console 22 and connect vertically to the assembly.

Thus it is seen that the present assembly provides DC grounding at one end to prevent "ground loop" where the variance in ground potential could cause the cable to heat up and AC grounding at both ends to provide RF shielding.

Certain modifications and additions will be obvious to those skilled in this art area. It is understood that all such additions and modifications have been deleted herein for the sake of conciseness and readability but are fully intended to fall within the scope of the following claims.

What is claimed is:

1. A radio frequency isolation system for geographically distant signal sources comprising AC and DC signals which develop differences in ground potential comprising;

a control cabinetry chassis acting as an electrical ground;

a DC input signal source electrically connected to said chassis at the input side of said cabinetry to ground said signal thereto;

a hybrid circuit connected to said chassis through capacitor means; and a AC input signal connected to said hybrid circuit for grounding said signal at both the input and output ends of said hybrid circuit to said chassis thereby.

2. A radio frequency isolation system as set forth in claim 1 wherein said capacitor means of said hybrid circuit includes a pair of parallel connected capacitors.

3. A radio frequency isolation system as set forth in claim 2 wherein said pair of series connected capacitors includes a first capacitor for handling high transient voltages and a second capacitor for handling frequencies in the range of 30 to 250 MHZ.

4. A radio frequency isolation system as set forth in claim 3 wherein said first capacitor is approximately 1 microfarad and said second capacitor is 0.05 microfarad.

5. A radio frequency isolation system as set forth in claim 3 including a large area electrically conductive hinge connected to said chassis.

6. A radio frequency isolation system as set forth in claim 2 wherein said DC input signals are loop signals having grounding only at the loop input end to said chassis.

7. A radio frequency isolation system as set forth in claim 6 wherein said AC input signals are loop signals having a second ground at the loop output end of said circuit.

8. A radio frequency isolation system as set forth in claim 7 wherein said AC and DC input signals are loop signals entering said chassis through N style bulkhead connectors having a transmit and a receive side.

9. A radio frequency isolation system as set forth in claim 8 wherein said transmit side has of said loop is grounded to said chassis through a keyhole connector connected thereto.

10. A radio frequency isolation system as set forth in claim 9 wherein said receive side of said loop is capacitively grounded to said chassis.

* * * * *